United States Patent
Takemura

(10) Patent No.: US 12,288,827 B2
(45) Date of Patent: Apr. 29, 2025

(54) WAVEGUIDE PHOTODETECTOR

(71) Applicant: Mitsubishi Electric Corporation, Tokyo (JP)

(72) Inventor: Ryota Takemura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 379 days.

(21) Appl. No.: 17/997,821

(22) PCT Filed: Oct. 9, 2020

(86) PCT No.: PCT/JP2020/038360
§ 371 (c)(1),
(2) Date: Nov. 2, 2022

(87) PCT Pub. No.: WO2022/074838
PCT Pub. Date: Apr. 14, 2022

(65) Prior Publication Data
US 2023/0178666 A1     Jun. 8, 2023

(51) Int. Cl.
*H01L 31/0232* (2014.01)
*H01L 31/0304* (2006.01)

(52) U.S. Cl.
CPC .. *H01L 31/02327* (2013.01); *H01L 31/03046* (2013.01)

(58) Field of Classification Search
None
See application file for complete search history.

(56) References Cited

U.S. PATENT DOCUMENTS

| | | | |
|---|---|---|---|
| 5,121,182 A | 6/1992 | Kuroda et al. | |
| 5,311,534 A * | 5/1994 | Mori | B82Y 20/00 372/45.01 |
| 5,912,475 A * | 6/1999 | Itagaki | H01S 5/06258 257/97 |

(Continued)

FOREIGN PATENT DOCUMENTS

| | | |
|---|---|---|
| JP | H04-211209 A | 8/1992 |
| JP | 2000-089054 A | 3/2000 |

(Continued)

OTHER PUBLICATIONS

International Search Report issued in PCT/JP2020/038360; mailed Dec. 22, 2020.

*Primary Examiner* — Cory W Eskridge
(74) *Attorney, Agent, or Firm* — Studebaker Brackett PLLC

(57) ABSTRACT

A ridge structure (7) including at least a light-absorbing layer (4) is provided on a semiconductor substrate (1). A semiconductor embedding layer (8) has a refractive index lower than that of the light-absorbing layer (4) and embeds a side surface of the light-absorbing layer (4). A semiconductor layer (13) has a refractive index between that of the light-absorbing layer (4) and that of the semiconductor embedding layer (8) and is provided between the side surface of the light-absorbing layer (4) and the semiconductor embedding layer (8). The refractive index of the semiconductor layer (13) is n3, a wavelength of the incident light (15) is λ, a thickness of the semiconductor layer (13) in a lateral direction is in a range of −30% to +20% of $\lambda/(4 \times n3)$.

4 Claims, 6 Drawing Sheets

(56) References Cited

U.S. PATENT DOCUMENTS

| | | | |
|---|---|---|---|
| 6,316,281 B1 | 11/2001 | Lee et al. | |
| 7,087,449 B2 * | 8/2006 | Kish, Jr. | H01L 31/109 |
| | | | 257/97 |
| 2002/0187580 A1 * | 12/2002 | Kondo | H01S 5/227 |
| | | | 438/47 |
| 2003/0209771 A1 * | 11/2003 | Akulova | H01S 5/227 |
| | | | 257/432 |
| 2008/0144994 A1 | 6/2008 | Nakaji et al. | |
| 2015/0241648 A1 * | 8/2015 | Kikuchi | H01L 31/035281 |
| | | | 438/69 |

FOREIGN PATENT DOCUMENTS

| | | |
|---|---|---|
| JP | 2002-314196 A | 10/2002 |
| JP | 2006-106587 A | 4/2006 |
| JP | 2008-153547 A | 7/2008 |
| JP | 2010-008807 A | 1/2010 |
| JP | 2013-055223 A | 3/2013 |

* cited by examiner

WAVEGUIDE PHOTODETECTOR

FIELD

The present disclosure relates to a waveguide photodetector used for an optical fiber communication and the like.

BACKGROUND

Communication system capacity has been increased along with exponential increase of communication capacity. Thus, speeding-up of optical communication instruments is needed. A CR time constant is one of factors that determine response speed of a photodiode (hereinafter referred to as PD), which is a semiconductor photodetector used in an optical communication instrument. The CR time constant is determined by element capacitance and element resistance of the semiconductor photodetector. The CR time constant needs to be decreased to increase the response speed. Thus, it is important to reduce the element capacitance.

Waveguide photodetectors have been employed to reduce the element capacitance and achieve high speed response of 40 GHz or higher, for example. Unlike a typical surface-incident structure, the photodetectors have a structure that allows light to be incident from a side surface of an epitaxial growth layer, which allows the sensitivity and band to be individually optimized. Thus, the structure is suitable for high-speed operation.

Waveguide photodetectors are roughly classified into two types. One of the types is a loaded photodetector. In the loaded photodetector, a light waveguide is formed up to a cleaved end face. Light is incident on the waveguide and guided to a light-absorbing layer formed at a position separated from this incident part by several µm, and evanescent light leaking in a layer thickness direction from a guide layer in the light-absorbing layer is photoelectrically converted. Thus, the photoelectric conversion is indirect, which provides advantage that photocurrent concentration near an incident end face is relaxed and the response speed is unlikely to degrade when high intensity light is incident. However, a problem is that since light leaking from the guide layer in the layer thickness direction is photoelectrically converted, it is difficult to obtain high sensitivity in principle.

To solve this problem, a structure that allows light to be directly incident on the light-absorbing layer and a structure in which the light-absorbing layer and the like are embedded by a Fe-doped InP layer have been disclosed. In these structures, light is directly incident on the light-absorbing layer through a window layer, and thus high sensitivity is obtained with a moderately long waveguide length. Thus, capacitance is small, and accordingly, high sensitivity and high-speed response are likely to be achieved.

However, a refractive index difference occurs at the interface between the light-absorbing layer and the semiconductor embedding layer, and light reflection occurs there. Returning light reflected by a photodetector returns toward a light-emitting element when connection is made with a fiber, and destabilizes operation of the light-emitting element. Thus, light reflection in the photodetector is preferably sufficiently small. In a disclosed structure (for example, refer to FIG. 7 in PTL 1), reflection at the connection interface between two light waveguides having different refractive indices is reduced by inserting, at the connection interface, a dielectric film having a refractive index at the middle of those of the light waveguides.

CITATION LIST

Patent Literature

[PTL 1] JP 2006-106587 A

SUMMARY

Technical Problem

However, it is difficult to stack a desired semiconductor layer on the dielectric film, and thus, in reality, it has been impossible to manufacture a waveguide photodetector in which the dielectric film is inserted at the interface between the light-absorbing layer and the semiconductor embedding layer.

An object of the present disclosure, which has been made to solve the above-described problem, is to provide a waveguide photodetector that can reduce light reflection inside a photodetector.

Solution to Problem

A waveguide photodetector according to the present disclosure includes: a semiconductor substrate; a ridge structure including at least a light-absorbing layer and provided on the semiconductor substrate; a semiconductor embedding layer embedding a side surface of the light-absorbing layer and having a refractive index lower than that of the light-absorbing layer; and a semiconductor layer provided between the side surface of the light-absorbing layer and the semiconductor embedding layer and having a refractive index between that of the light-absorbing layer and that of the semiconductor embedding layer, wherein the refractive index of the semiconductor layer is n3, a wavelength of the incident light is $\lambda$, a thickness of the semiconductor layer in a lateral direction is in a range of −30% to +20% of $\lambda/(4 \times n3)$.

Advantageous Effects of Invention

In the present disclosure, a semiconductor layer having a refractive index between that of the light-absorbing layer and that of the semiconductor embedding layer is provided between the surface of the light-absorbing layer and the semiconductor embedding layer. A thickness of the semiconductor layer in a lateral direction is in a range of −30% to +20% of $\lambda/(4 \times n3)$. Accordingly, the incident light is reflected at front and back side surfaces of the semiconductor layer, and reflected lights thereof interfere with each other and cancel each other. As a result, light reflection inside the photodetector is reduced. Thus, with returning light reduction, operation of a light-emitting element is stabilized.

DESCRIPTION OF EMBODIMENTS

A waveguide photodetector according to the embodiments of the present disclosure will be described with reference to the drawings. The same components will be denoted by the same symbols, and the repeated description thereof may be omitted.

Embodiment 1

Figure 1:
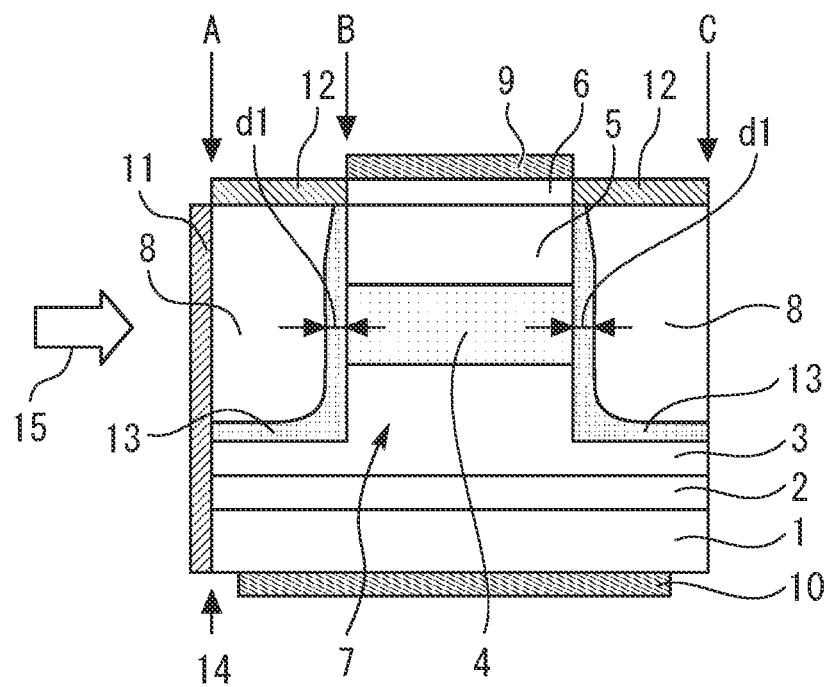
FIG. 1 is a cross-sectional view illustrating a waveguide photodetector according to Embodiment 1.

FIG. 1 is a cross-sectional view illustrating a waveguide photodetector according to Embodiment 1. FIG. 1 is a cross-sectional diagram in a light incident direction. An n-type contact layer 2, an n-type clad layer 3, a light-absorbing layer 4 made of InGaAs, a p-type clad layer 5, and a p-type contact layer 6 are sequentially stacked on an InP substrate 1. A ridge structure 7 including at least the light-absorbing layer 4 is provided on the InP substrate 1. Both sides of the ridge structure 7, in other words, side surfaces of the light-absorbing layer 4 are embedded by semiconductor embedding layers 8 having a refractive index lower than that of the light-absorbing layer 4. A p-type electrode metal 9 is provided on the p-type contact layer 6.

A back surface metal 10 is entirely or partially provided on a back surface of the InP substrate 1. An antireflection film 11 is provided at at least part of a light entrance surface 14 at which light is incident. A part other than the contact layer on a front surface side is covered by a passivation film 12. Note that the back surface metal 10, the antireflection film 11, and the passivation film 12 may be omitted.

A semiconductor layer 13 made of InGaAsP is provided between each surface of the light-absorbing layer 4 and a corresponding semiconductor embedding layer 8. Specifically, the semiconductor layers 13 are provided between a front side surface of the light-absorbing layer 4 on the light entrance surface 14 side and one of the semiconductor embedding layers 8 on the light entrance surface 14 side and between a back side surface of the light-absorbing layer 4 on a side opposite to the light entrance surface 14 and the other semiconductor embedding layer 8 on the back side. A refractive index n3 of each semiconductor layer 13 is a refractive index between those of the light-absorbing layer 4 and each semiconductor embedding layer 8. Incident light 15 is incident on the light entrance surface 14. A thickness d1 of each semiconductor layer 13 in a lateral direction is set to be λ/(4×n3) approximately, where λ represents the wavelength of the incident light 15.

Figure 2:
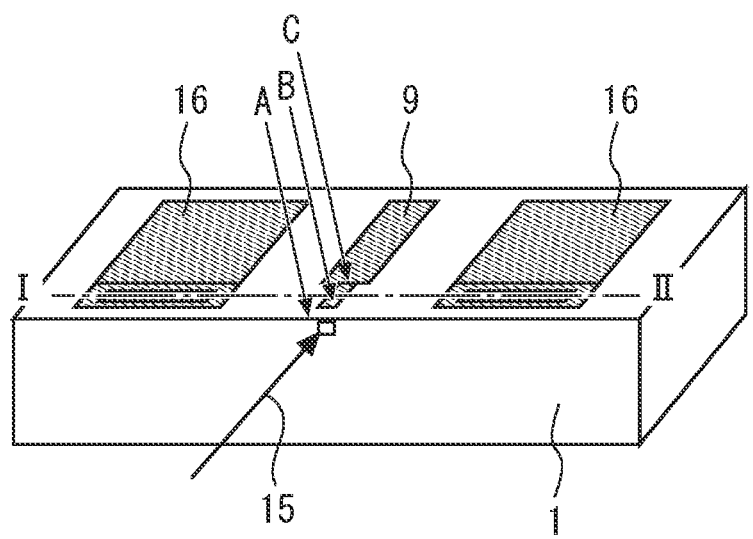
FIG. 2 is a perspective view illustrating the waveguide photodetector according to Embodiment 1.
Figure 3:
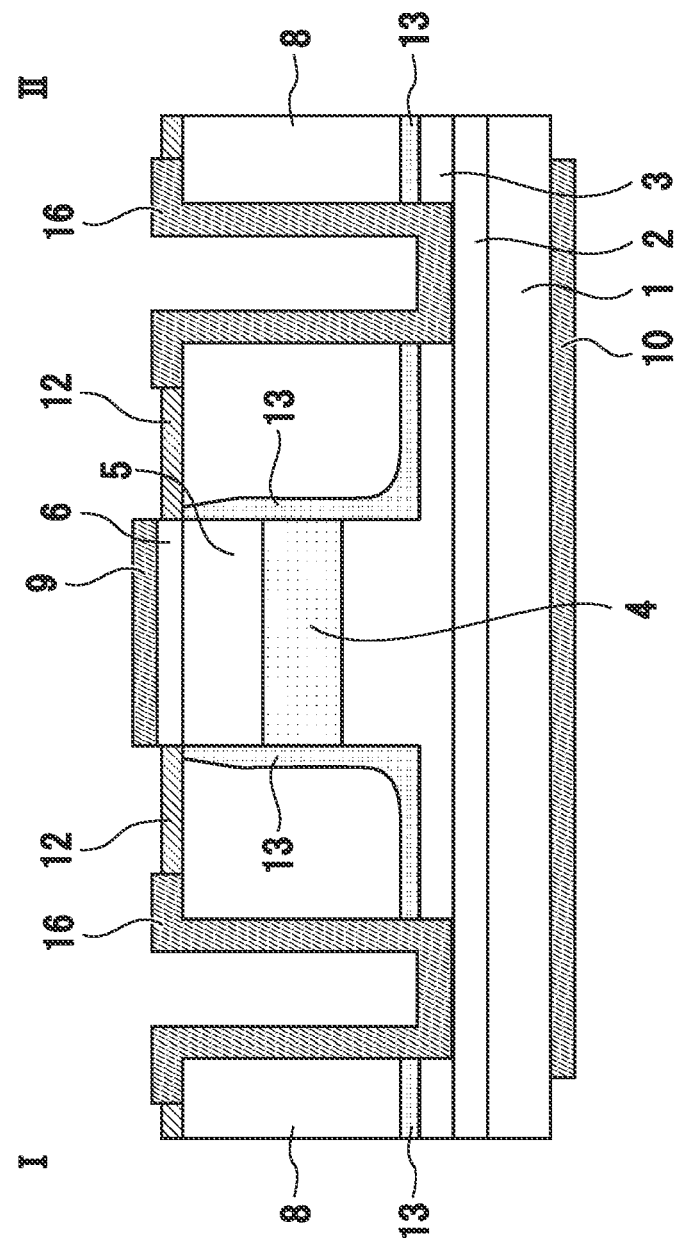
FIG. 3 is a cross-sectional diagram along I-II in FIG. 2.

FIG. 2 is a perspective view illustrating the waveguide photodetector according to Embodiment 1. FIG. 3 is a cross-sectional diagram along I-II in FIG. 2. FIG. 3 is a cross-sectional diagram orthogonal to the light incident direction. N-type electrode metals 16 connected to the n-type contact layer 2 are provided at places where the ridge structure 7 including the light-absorbing layer 4 does not exist.

For example, liquid phase epitaxy (LPE), vapor phase epitaxy (VPE) such as metal organic VPE (MO-VPE), or molecular beam epitaxy (MBE) is used as a crystal growth method for each semiconductor layer of the above-described waveguide photodetector.

After the crystal growth of each semiconductor layer by the above-described method, an insulating film mask is formed by a typical lithography technology. Thereafter, any semiconductor layer at a part not covered by the insulating film mask is etched halfway through the n-type clad layer 3 by dry etching such as reactive ion etching (RIE) or by wet etching. Thereafter, the semiconductor layers 13 and the semiconductor embedding layers 8 are formed by crystal growth at a part etched by MO-VPE or the like.

The passivation film 12 is formed by depositing an insulating film by a method such as plasma-enhanced chemical vapor deposition (PE-CVD) or sputter and then etching the insulating film at an unnecessary part with a mask left only at a desired part by using a typical lithography technology. Subsequently, places where the semiconductor layers 13 and the semiconductor embedding layers 8 are formed by crystal growth are partially etched up to directly above the n-type contact layer 2 by dry etching such as RIE or by wet etching.

The p-type electrode metal 9 and the n-type electrode metals 16 are formed by depositing a material such as Ti, Pt, or Au by a method such as electron beam evaporation or sputter with a mask opened only at a desired part by using a typical lithography technology and then removing metal at an unnecessary part. Alternatively, the p-type electrode metal 9 and the n-type electrode metals 16 may be formed by depositing metal on the entire surface and then wet-etching the metal at an unnecessary part with a mask left only at a desired part by using a typical lithography technology.

The back surface metal 10 is formed by placing the InP substrate 1 upside down, depositing a material such as Ti, Pt, or Au by a method such as electron beam evaporation or sputter with a mask opened only at a desired part by using a typical lithography technology, and removing metal at an unnecessary part. Alternatively, the back surface metal 10 may be formed by depositing metal on the entire surface and then wet-etching the metal at an unnecessary part with a mask left only at a desired part by using a typical lithography technology. The antireflection film 11 is formed at an end face of a cleaved chip by evaporation or sputter.

Figure 4:
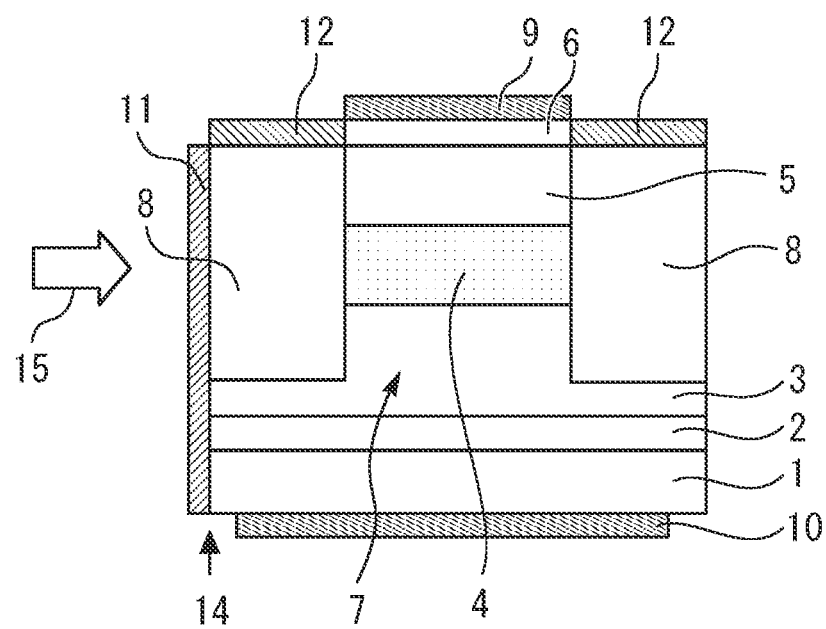
FIG. 4 is a cross-sectional view illustrating a waveguide photodetector according to the comparative example.

Effects of the present embodiment will be described below in comparison with a comparative example. FIG. 4 is a cross-sectional view illustrating a waveguide photodetector according to the comparative example. No semiconductor layer 13 is provided in the comparative example. When light is incident on the light entrance surface 14, the incident light passes through the semiconductor embedding layer 8 and reaches the light-absorbing layer 4. In this case, a refractive index difference exists between the semiconductor embedding layer 8 and the light-absorbing layer 4, and thus light reflection occurs. In addition, light not absorbed by the light-absorbing layer 4 travels toward the semiconductor embedding layer 8 on the back side of the light-absorbing layer 4, and light reflection also occurs at the interface between the light-absorbing layer 4 and the semiconductor embedding layer 8. As a result, an increased amount of light returns to the light entrance surface 14 side.

However, in the present embodiment, the semiconductor layers 13 having a refractive index between those of the light-absorbing layer 4 and each semiconductor embedding layer 8 are provided on the side surfaces of the light-absorbing layer 4 embedded by the semiconductor embedding layers 8. The thickness d1 of each semiconductor layer 13 in the lateral direction is set to be $\lambda/(4 \times n3)$ approximately.

Figure 5:
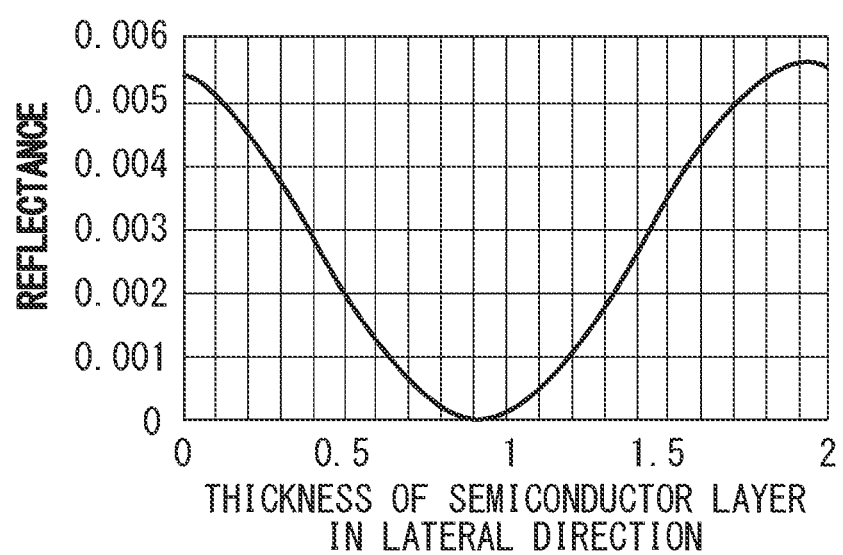
FIG. 5 is a diagram illustrating a result of calculation of light reflectance inside the photodetector against the semiconductor layer thickness in the lateral direction in the structure illustrated in FIG. 1.

FIG. 5 is a diagram illustrating a result of calculation of light reflectance inside the photodetector against the semiconductor layer thickness in the lateral direction in the structure illustrated in FIG. 1. The horizontal axis represents the thickness d1 of each semiconductor layer 13 in the lateral direction, which is normalized with $\lambda/(4 \times n3)$. In the calculation, the wavelength $\lambda$ of the incident light 15 is 1550 nm, the refractive index of each semiconductor embedding layer 8 is 3.17, the real part of the refractive index of the light-absorbing layer 4 is 3.67, the imaginary part thereof is −0.084, and the refractive index n3 is 3.4. It can be understood that light reflection inside the photodetector can be sufficiently reduced when the thickness d1 of each semiconductor layer 13 in the lateral direction is equal to $\lambda/(4 \times n3)$ approximately.

For example, when the wavelength 2 of the incident light 15 is 1550 nm, the refractive index of each semiconductor embedding layer 8 is 3.17, and the refractive index of the light-absorbing layer 4 is 3.67, the reflectance at the interface between the semiconductor embedding layer 8 on the front side and the front side surface of the light-absorbing layer 4 is 22.6 dB in the comparative example. In the present embodiment, the reflectance is −29.1 dB when the refractive index n3 is 3.3 and the thickness d1 is 117 nm. The reflectance is reduced by 6.5 dB, and accordingly, a corresponding amount of returning light is reduced. Similarly, reflection at the interface between the back side surface of the light-absorbing layer 4 and the semiconductor embedding layer 8 on the back side is −22.1 dB in the comparative example and −28.6 dB in the present embodiment, and the reflectance is reduced by 6.5 dB.

However, according to FIG. 5, it can be understood that the reflectance is reduced to 0.01% or lower, which causes no problem in practical use, when the thickness d1 of each semiconductor layer 13 in the lateral direction is in the range of −30% to +20% of $\lambda/(4 \times n3)$. Thus, the thickness of each semiconductor layer 13 in the lateral direction is set to be in the range of −30% to +20% of $\lambda/(4 \times n3)$. Accordingly, the incident light 15 is reflected at front and back side surfaces of each semiconductor layer 13, and reflected lights thereof interfere with each other and cancel each other. As a result, light reflection inside the photodetector is reduced. Thus, with returning light reduction, operation of a light-emitting element is stabilized.

In a disclosed conventional technology of inserting a dielectric film at the connection interface between two light waveguides having different refractive indices, it is difficult to stack a desired semiconductor layer on the dielectric film. However, in the present embodiment, epitaxial growth of each semiconductor embedding layer 8 on the corresponding semiconductor layers 13 is possible through a typical semiconductor process. Thus, a waveguide photodetector including the semiconductor layer 13 can be manufactured. For example, in a case of MO-VPE, the rate of growth of the semiconductor layer 13 in the lateral direction can be controlled, for example, by the amount of gas flow or by pressure and temperature, and thus layer thickness controllability, which is difficult in deposition of the dielectric film, is high.

Note that the InP substrate 1 is preferably a semi-insulating substrate doped with Fe. The material of the n-type contact layer 2 may be, for example, InGaAs, InP, InGaAsP, AlInAs, AlGaInAs, or a combination thereof. The material of the n-type clad layer 3 may be, for example, InP, InGaAsP, AlInAs, AlGaInAs, or a combination thereof. The material of the light-absorbing layer 4 is not limited to InGaAs but may be any material in which carriers are generated at light incidence, in other words, any material having a small bandgap relative to incident light and may be, for example, InGaAsP, InGaAsSb, or a combination thereof. The material of the p-type clad layer 5 may be, for example, InP, InGaAsP, AlInAs, AlGaInAs, or a combination thereof. The material of the p-type contact layer 6 may be, for example, InGaAs, InP, InGaAsP, AlInAs, AlGaInAs, or a combination thereof. The material of the semiconductor embedding layer 8 may be, for example, InP or InGaAsP and doped with Fe or Ru. To reduce band discontinuity, a band discontinuity reduction layer made of, for example, InGaAsP or AlGaInAs may be provided between epitaxial layers or between the p-type electrode metal 9 and an epitaxial layer. The material of the passivation film 12 may be $SiO_2$, SiN, SiON, or a combination thereof. Any material may be used as each layer as long as characteristics that are necessary for operation of the waveguide photodetector are obtained, and the range thereof is not limited to the above-described materials.

A group II atom such as Be, Mg, Zn, or Cd is used as a p-type dopant that provides conductivity to group III-V semiconductor crystal. A group VI atom such as S, Se, or Te is used as an n-type dopant. A group IV atom such as C, Si, Ge, or Sn is used as amphoteric impurity that functions as a dopant of any conduction type depending on semiconductor crystal. An atom such as Fe or Ru functions as an insulating dopant of a semi-insulating (SI) type with reduced conductivity.

Embodiment 2

In Embodiment 1, the reflectance is reduced by setting the thickness d1 of each semiconductor layer 13 in the lateral direction to be $\lambda/(4 \times n3)$ approximately. However, to be exact, the imaginary part of the refractive index of the light-absorbing layer 4 is not zero since the light-absorbing layer 4 is made of a light-absorbing material. Thus, as illustrated in FIG. 5, the reflectance is 0.014% when the thickness d1 is equal to $2/(4 \times n3)=114$ nm, but the reflectance is reduced to 0.003% when the thickness d1 is shortened to 105 nm. Specifically, the reflectance has a local minimum when the thickness d1 of each semiconductor layer 13 in the lateral direction is smaller than $2/(4 \times n3)$. Thus, in the present embodiment, the thickness d1 of each semiconductor layer 13 in the lateral direction is set to be a thickness that is shorter than $N/(4 \times n3)$ and with which the reflectance of the incident light 15 has a local minimum. Accordingly, the reflectance is further reduced.

Embodiment 3

Figure 6:
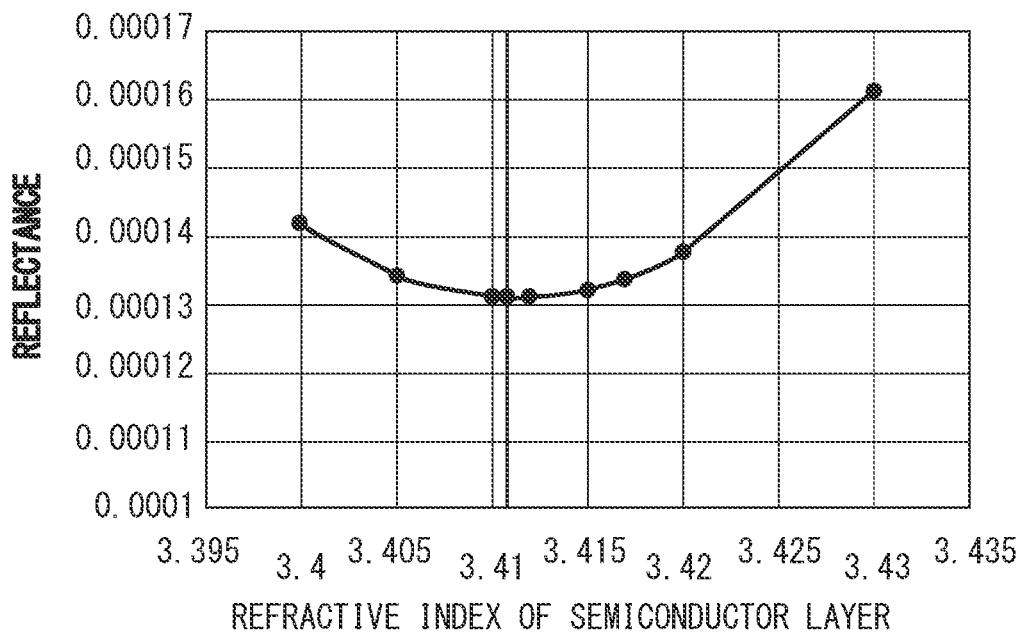
FIG. 6 is a diagram illustrating a result of reflectance calculation against the refractive index of each semiconductor layer in the structure illustrated in FIG. 1.

FIG. 6 is a diagram illustrating a result of reflectance calculation against the refractive index of each semiconductor layer in the structure illustrated in FIG. 1. In the calculation, the wavelength 2 of the incident light 15 is 1550 nm, the thickness d1 is $\lambda/(4\times n3)$, a refractive index n1 of each semiconductor embedding layer 8 is 3.17, and a refractive index n2 of the light-absorbing layer 4 is 3.67. It can be understood that the reflectance has a local minimum when the refractive index n3 of each semiconductor layer 13 is 3.41. Thus, in the present embodiment, the refractive index n3 of each semiconductor layer 13 is set to be a value with which the reflectance of the incident light 15 takes a local minimum value. Specifically, the reflectance is reduced to a local minimum when the refractive index n3 is set to be $(n1\times n2)^{\wedge}0.5$.

Embodiment 4

Figure 7:
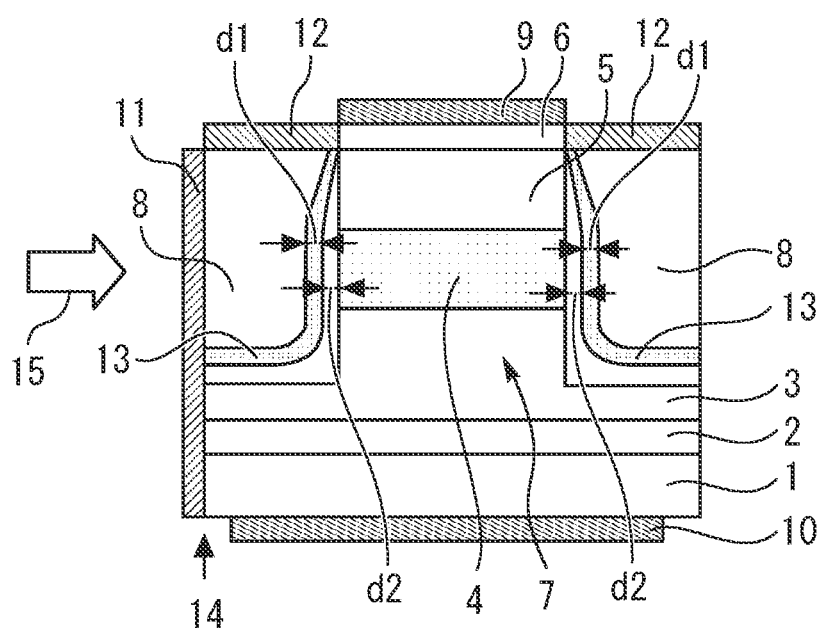
FIG. 7 is a cross-sectional view illustrating a waveguide photodetector according to Embodiment 4.
Figure 8:
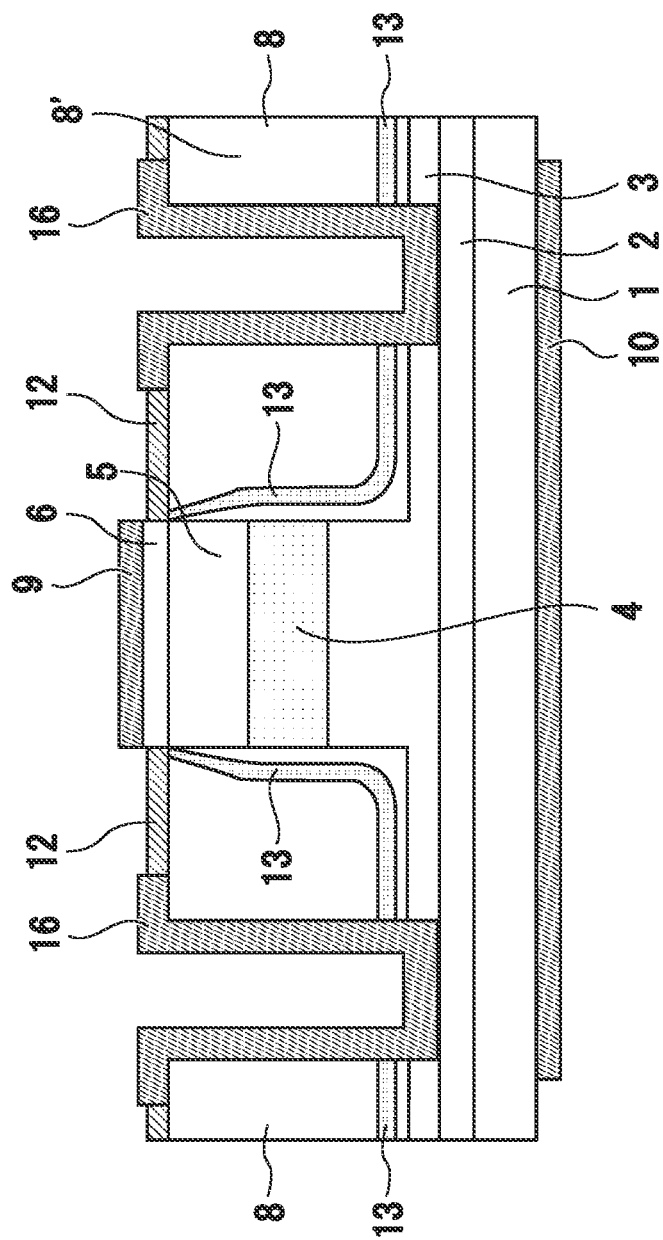
FIG. 8 is a cross-sectional view illustrating a waveguide photodetector according to Embodiment 4.

FIGS. 7 and 8 are cross-sectional views illustrating a waveguide photodetector according to Embodiment 4. FIG. 7 is a cross-sectional diagram in the light incident direction. FIG. 8 is a cross-sectional diagram orthogonal to the light incident direction. Each semiconductor layer 13 contacts the light-absorbing layer 4 in Embodiment 1, but in the present embodiment, each semiconductor embedding layer 8 is also provided between a side surface of the light-absorbing layer 4 and a semiconductor layer 13. An interval d2 between each side surface of the light-absorbing layer 4 and the corresponding semiconductor layer 13 in the lateral direction is set to be $2/(2\times n1)$ approximately. The other configuration is the same as in Embodiment 1, and the thickness d1 of each semiconductor layer 13 in the lateral direction is set to be $\lambda/(4\times n3)$ approximately.

The configuration according to the present embodiment can be achieved through growth of the semiconductor embedding layers 8 for the first time on both sides of the ridge structure 7 formed by etching such as MO-VPE and then through sequential crystal growth of the semiconductor layers 13 and the semiconductor embedding layers 8 for the second time. The other formation method is the same as in Embodiment 1.

Figure 9:
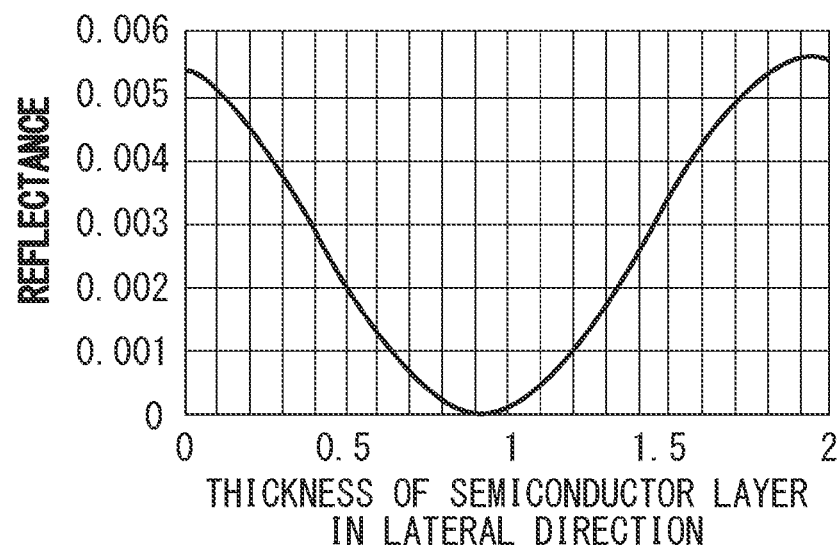
FIG. 9 is a diagram illustrating a result of calculation of light reflectance inside the photodetector against the thickness of each semiconductor layer in the lateral direction in the structure illustrated in FIGS. 7 and 8.

FIG. 9 is a diagram illustrating a result of calculation of light reflectance inside the photodetector against the thickness of each semiconductor layer in the lateral direction in the structure illustrated in FIGS. 7 and 8. The horizontal axis represents the thickness d1 of each semiconductor layer 13 in the lateral direction, which is normalized with $\lambda/(4\times n3)$. In the calculation, the wavelength 2 of the incident light 15 is 1550 nm, the refractive index of each semiconductor embedding layer 8 is 3.17, the real part of the refractive index of the light-absorbing layer 4 is 3.67, the imaginary part thereof is −0.084, and the refractive index n3 is 3.4. It can be understood that light reflection inside the photodetector is sufficiently reduced when the thickness d1 of each semiconductor layer 13 in the lateral direction is equal to $\lambda/(4\times n3)$ approximately.

As described above, in the comparative example, the reflectance at the interface between the semiconductor embedding layer 8 on the front side and the front side surface of the light-absorbing layer 4 is 22.6 dB. In the present embodiment, the reflectance is −29.2 dB when the refractive index n3 is 3.3, the thickness d1 is 117 nm, and the interval d2 is 244 nm. The reflectance is reduced by 6.6 dB, and accordingly, a corresponding amount of returning light is reduced. Similarly, reflection at the interface between the back side surface of the light-absorbing layer 4 and the semiconductor embedding layer 8 on the back side is −22.1 dB in the comparative example and −28.5 dB in the present embodiment, and the reflectance is reduced by 6.4 dB.

However, according to FIG. 9, it can be understood that the reflectance is reduced to 0.01% or lower, which causes no problem in practical use, when the thickness d1 of each semiconductor layer 13 in the lateral direction is in the range of −30% to +20% of $\lambda/(4\times n3)$. Thus, the thickness of each semiconductor layer 13 in the lateral direction is set to be in the range of −30% to +20% of $\lambda/(4\times n3)$. Accordingly, the incident light 15 is reflected at the front and back side surfaces of each semiconductor layer 13, and reflected lights thereof interfere with each other and cancel each other. As a result, light reflection inside the photodetector is reduced. Thus, with returning light reduction, operation of the light-emitting element is stabilized.

In the present embodiment, each semiconductor embedding layer 8 is also provided between a side surface of the light-absorbing layer 4 and a semiconductor layer 13. Accordingly, the semiconductor embedding layers 8 having a refractive index smaller than that of each semiconductor layer 13, in other words, having a smaller bandgap contact the side surfaces of the light-absorbing layer 4. Thus, leakage current flowing through the side surfaces of the light-absorbing layer 4 is reduced, and long-period reliability is improved.

Embodiment 5

In Embodiment 4, the reflectance is reduced by setting the thickness d1 of each semiconductor layer 13 in the lateral direction to be $\lambda/(4\times n3)$ approximately. However, to be exact, the imaginary part of the refractive index of the light-absorbing layer 4 is not zero since the light-absorbing layer 4 is made of a light-absorbing material. Thus, as illustrated in FIG. 9, the reflectance is 0.012% when the thickness d1 is equal to $\lambda/(4\times n3)=114$ nm, but the reflectance is reduced to 0.003% when the thickness d1 is shortened to 105 nm. Specifically, the reflectance has a local minimum when the thickness d1 of each semiconductor layer 13 in the lateral direction is smaller than $2/(4\times n3)$. Thus, in the present embodiment, the thickness d1 of each semiconductor layer 13 in the lateral direction is set to be a thickness that is shorter than $N/(4\times n3)$ and with which the reflectance of the incident light 15 has a local minimum. Accordingly, the reflectance is further reduced.

Embodiment 6

Figure 10:
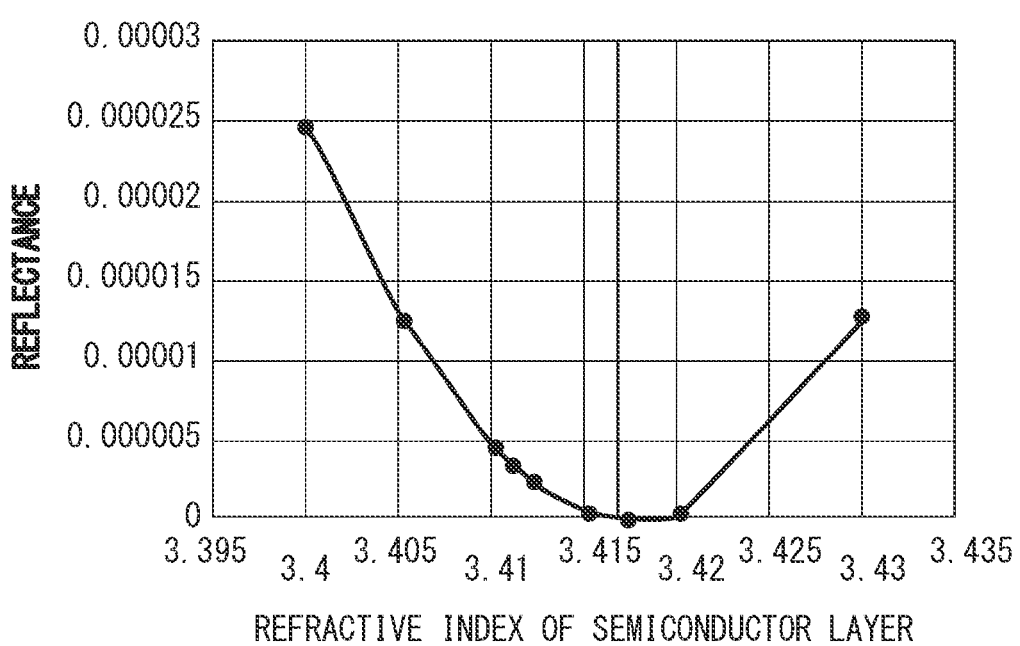
FIG. 10 is a diagram illustrating a result of reflectance calculation against the refractive index of each semiconductor layer in the structure illustrated in FIGS. 7 and 8.

FIG. 10 is a diagram illustrating a result of reflectance calculation against the refractive index of each semiconductor layer in the structure illustrated in FIGS. 7 and 8. In the calculation the wavelength $\lambda$ of the incident light 15 is 1550 nm, the thickness d1 is $2/(4\times n3)$, the refractive index n1 is 3.17, and the refractive index n2 is 3.67. It can be understood that the reflectance has a local minimum when the refractive index n3 of each semiconductor layer 13 is 3.417. Thus, in the present embodiment, the refractive index n3 of each semiconductor layer 13 is set to be a value with which the reflectance of the incident light 15 takes a local minimum value. Note that, although the reflectance has a local minimum when the refractive index n3 is set to be $(n1\times n2)^{\wedge}0.5$ in Embodiment 3, the calculation in the present embodiment indicates that the reflectance is further reduced when the refractive index n3 is set to be larger than the value. This is unique to a case in which the imaginary part of the refractive index of the light-absorbing layer 4 is not zero.

REFERENCE SIGNS LIST

1 InP substrate (semiconductor substrate); 4 light-absorbing layer; 7 ridge structure; 8 semiconductor embedding layer; 13 semiconductor layer

The invention claimed is:

1. A waveguide photodetector comprising:
a semiconductor substrate;
a ridge structure including at least a light-absorbing layer and provided on the semiconductor substrate;
a semiconductor embedding layer embedding a side surface of the light-absorbing layer and having a refractive index lower than that of the light-absorbing layer; and
a semiconductor layer provided between the side surface of the light-absorbing layer and the semiconductor embedding layer and having a refractive index between that of the light-absorbing layer and that of the semiconductor embedding layer,
wherein the refractive index of the semiconductor layer is n3, a wavelength of the incident light is $\lambda$, a thickness of the semiconductor layer in a lateral direction is in a range of −30% to +20% of $\lambda/(4 \times n3)$,
the semiconductor embedding layer is provided between the side surface of the light-absorbing layer and the semiconductor layer, and
a refractive index of the semiconductor embedding layer is n1, and an interval between the side surface of the light-absorbing layer and the semiconductor layer in the lateral direction is $\lambda/(2 \times n1)$.

2. The waveguide photodetector according to claim 1, wherein an imaginary part of the refractive index of the light-absorbing layer is not zero, the refractive index of the semiconductor layer is n3, a wavelength of the incident light is $\lambda$, the thickness of the semiconductor layer in the lateral direction is set to be a thickness that is shorter than $\lambda/(4 \times n3)$ and with which the reflectance of the incident light has a local minimum.

3. The waveguide photodetector according to claim 1, wherein the refractive index of the semiconductor layer is set to be a value with which the reflectance of the incident light takes a local minimum value.

4. The waveguide photodetector according to claim 2, wherein the refractive index of the semiconductor layer is set to be a value with which the reflectance of the incident light takes a local minimum value.

* * * * *